(12) United States Patent
Regan et al.

(10) Patent No.: US 10,944,019 B2
(45) Date of Patent: Mar. 9, 2021

(54) PHOTOVOLTAIC BATTERY

(71) Applicant: X Development LLC, Mountain View, CA (US)

(72) Inventors: William Regan, San Carlos, CA (US); Jason Rugolo, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 261 days.

(21) Appl. No.: 16/042,226

(22) Filed: Jul. 23, 2018

(65) Prior Publication Data

US 2020/0028012 A1    Jan. 23, 2020

(51) Int. Cl.
| | |
|---|---|
| *H01L 31/042* | (2014.01) |
| *H01L 31/053* | (2014.01) |
| *H01L 31/054* | (2014.01) |
| *H01L 31/12* | (2006.01) |
| *C25B 3/00* | (2021.01) |
| *H02S 10/40* | (2014.01) |
| *H02J 7/35* | (2006.01) |
| *H02S 40/32* | (2014.01) |

(52) U.S. Cl.
CPC .............. *H01L 31/053* (2014.12); *C25B 3/00* (2013.01); *H01L 31/0547* (2014.12); *H01L 31/12* (2013.01); *H02J 7/35* (2013.01); *H02S 10/40* (2014.12); *H02S 40/32* (2014.12)

(58) Field of Classification Search
CPC .................................................. H01L 31/053
USPC ........................................................ 136/244
See application file for complete search history.

(56) References Cited

U.S. PATENT DOCUMENTS

| | | | |
|---|---|---|---|
| 4,135,537 A | 1/1979 | Blieden et al. | |
| 4,454,372 A | 6/1984 | Appleby | |
| 8,916,764 B2 | 12/2014 | Weir | |
| 10,591,138 B1* | 3/2020 | Blackdiamond | ....... B65D 35/44 |
| 2008/0113216 A1* | 5/2008 | Inoue | ................... H01L 51/0087 |
| | | | 428/690 |

(Continued)

FOREIGN PATENT DOCUMENTS

DE        3036269 A1     5/1982

OTHER PUBLICATIONS

Quant et al., "Low Molecular Weight Norbomadiene Derivatives for Molecular Solar-Thermal Energy Storage," Chemistry: A European Journal, 2016, vol. 22, pp. 13265-13274.

(Continued)

*Primary Examiner* — Daniel J Cavallari
*Assistant Examiner* — Dru Parries
(74) *Attorney, Agent, or Firm* — Christensen O'Connor Johnson Kindness PLLC

(57) ABSTRACT

A photovoltaic power system includes a photofuel having a molecular structure to emit light, and a receptacle including the photofuel disposed within. One or more photovoltaic cells are positioned within the receptacle to receive light emitted from the photofuel, and a negative electrode is coupled to the one or more photovoltaic cells. A positive electrode is coupled to the one or more photovoltaic cells to produce an electrical potential between the negative electrode and the positive electrode when a photocurrent is generated by the one or more photovoltaic cells in response to the one or more photovoltaic cells receiving the light emitted from the photofuel.

26 Claims, 8 Drawing Sheets

(56) References Cited

U.S. PATENT DOCUMENTS

| | | |
|---|---|---|
| 2012/0042933 A1 | 2/2012 | Gruss et al. |
| 2013/0314006 A1* | 11/2013 | Lan ..................... B60L 3/0046 318/139 |
| 2016/0093411 A1* | 3/2016 | Tompson, Jr. .......... G21F 5/008 376/156 |
| 2018/0132332 A1* | 5/2018 | Akhavan-Tafti ....... H05B 33/26 |

OTHER PUBLICATIONS

Sol et al., "Temperature-Responsive Luminescent Solar Concentrators: Tuning Energy Transfer in a Liquid Crystalline Matrix," Angewandte Chemie International Edition, 2018, vol. 57, pp. 1030-1033.

U.S. Appl. No. 16/006,553, Photovoltaic Conversion of Light, filed Jun. 12, 2018, 38 pages.

* cited by examiner

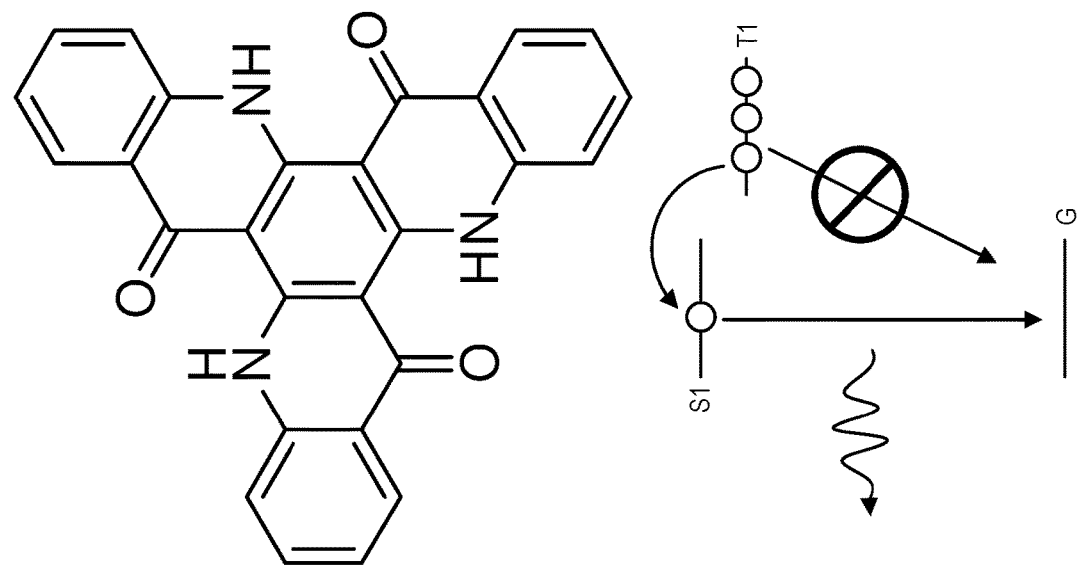
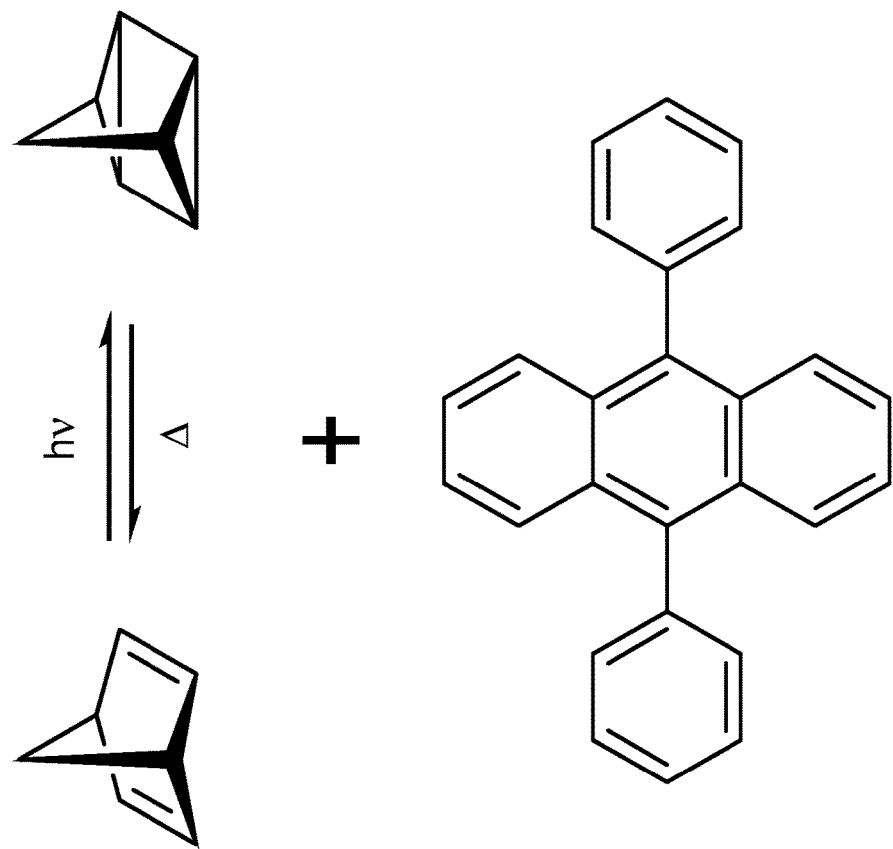
FIG. 4B
FIG. 4A

PHOTOVOLTAIC BATTERY

TECHNICAL FIELD

This disclosure relates generally to photovoltaic devices.

BACKGROUND INFORMATION

Non-stationary energy storage is limited to a few dominant technologies, either combustion of fuels (e.g. in internal combustion engines) or electrochemical reactions in open- or closed-cell geometries. For non-stationary electronics applications (e.g. laptops, cell phones, tablets), closed-cell batteries such as lithium ion are the predominant energy storage solution. These technologies may suffer certain drawbacks that limit current or future applications: (a) fossil hydrocarbon combustion releases the greenhouse gas $CO_2$, and biofuels (low net $CO_2$) compete with food production, (b) gasoline cannot easily be "recharged" like a battery, (c) lithium ion batteries are efficiently charged/discharged but are expensive, limited in energy density, and slow to recharge, (d) fuel cells are generally expensive, and (e) redox flow batteries are limited in energy density.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

FIGS. 4A-4D illustrate chemicals and reaction mechanisms that may be used in the photofuel, in accordance with embodiments of the disclosure.

DETAILED DESCRIPTION

Figure 1A:
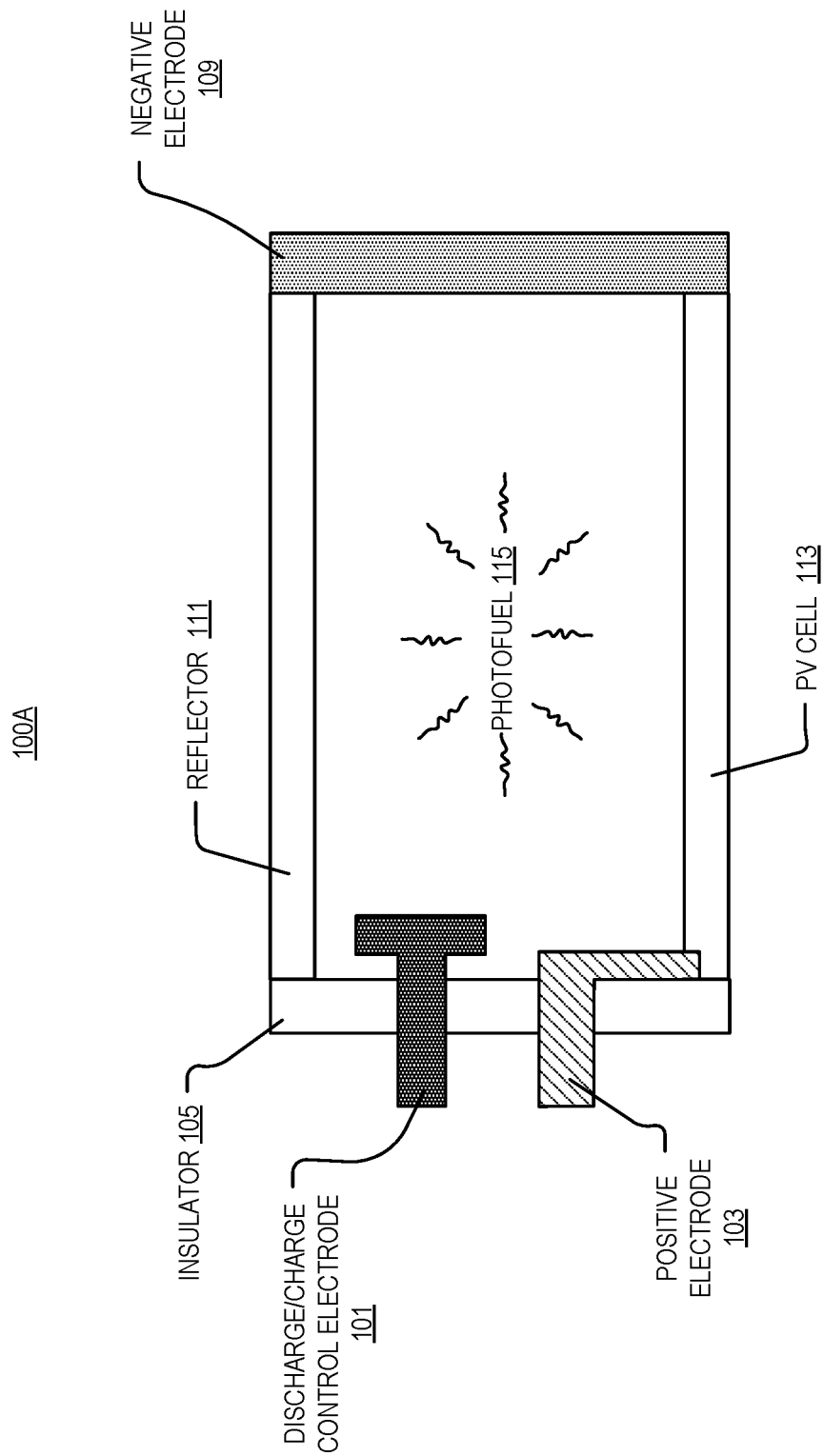
FIG. 1A illustrates part of a photovoltaic power system, in accordance with an embodiment of the disclosure.

Embodiments of a system and method for a photovoltaic battery are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Generally this disclosure relates to a new paradigm in macroscopic energy storage: a photovoltaic battery. The instant disclosure proposes releasing stored chemical energy as light—referring to the one or more light-releasing compounds (and their carrier solvents, matrices, stabilizers, and other compounds in the mixture) as "photofuel"—and then efficiently converting this emitted light to electricity using photovoltaics. Several families of multi-molecule and single-molecule chemical reactions are promising photofuel candidates (e.g., delayed fluorescence, chemiluminescent/bioluminescent reactions, etc.). These molecules may be contained within a "photovoltaic battery" (e.g., any device to convert the emitted light to electricity) to convert emitted light into electricity.

The disclosure herein provides economical solutions for both sustainable, low-cost, high energy density transportation energy storage (including aviation fuel), high energy density closed-cell solutions for consumer electronics energy-storage, and a way to achieve on-demand, low-cost solar energy. For transportation, photofuel may be capable of high energy density (>400 Wh/kg—exceeding today's batteries), can be easily recharged (either electrochemically, thermochemically, or photochemically), may not release $CO_2$ on net, and may be inexpensive due to current bulk chemical synthesis capabilities.

This disclosure offers a compelling way to concentrate and store energy, enabling low-cost storage and extremely efficient conversion to electricity by photovoltaics—e.g., by choosing a PV material with a bandgap matched to the near-monochromatic, high-intensity emission of the photofuel. It is appreciated that the device architectures disclosed herein further convey reversibility advantages over electrochemical batteries. In electrochemical batteries, ions need to pass through membranes and intercalate into electrodes, and this process may damage or otherwise inhibit the membranes over time, (e.g., via dendrite formation, or may decrease capacity by irreversible side reactions). Here, energy is stored intramolecularly: meaning that molecules in the photofuel may be designed to reversibly switch between charged and uncharged states so the bulk device experiences minimal degradation. Put another way, energy is stored and released via local chemical bonds or intramolecular excitations.

The following disclosure will discuss the embodiments described above, and other embodiments, as they relate to the figures.

FIG. 1A illustrates a cross section of part of a photovoltaic power system 100A, in accordance with an embodiment of the disclosure. As shown, photovoltaic power system 100A includes charging electrode 101, positive electrode 103, insulator 105, negative electrode 109, reflector 111, photovoltaic cell 113, and photofuel 115.

In the depicted embodiment, photofuel 115 has a molecular structure (see, e.g., FIGS. 4A-4D) to emit light, and photofuel 115 is disposed within a receptacle (e.g., formed by insulator 105, negative electrode 109, reflector 111, and photovoltaic cell 113). Photofuel 115 may have a chemical composition such that it can absorb energy, convert the absorbed energy into chemical potential energy (e.g., excite an electron into a high-energy state, induce a photochemical reaction, transform an isomer, etc.), and later convert the stored chemical energy into light. In some embodiments, where photofuel 115 absorbs light and converts light into chemical energy, photofuel 115 may be designed to have a wide absorption spectrum (e.g., including visible and non-visible portions of the solar spectrum) but a relatively narrow emission spectrum (e.g., substantially monochromatic light). In some embodiments, the chemical potential energy may be supplied through electricity or other forms of energy (e.g., heat). Photofuel "charge" mechanisms may include direct excitation of single molecule with light or photolysis, electrical/electrochemical excitation of single molecule, various chemical syntheses (e.g. electrochemical, thermochemical), or the like.

As shown one or more photovoltaic cells 113 (e.g., Si-based photovoltaic cells, organic photovoltaic cells, CdTe photovoltaic cells, perovskite photovoltaic cells, any of the III-V or II-VI group solar cells, or the like) are positioned within the receptacle to receive light emitted from the photofuel 115. Various antireflective coatings may be on the surface of photovoltaic cells 113 (e.g., surface textures, coatings with different indices of refraction than the photofuel, etc.). Photovoltaic cells 113 may be coated with a dye to improve efficiency (e.g., discharge occurs at the photovoltaic surface, via a dye that acts as a catalyst or a dye catalyst combination). In some embodiments, photovoltaic cells 113 may be optimized to eliminate shunt currents. Negative electrode 109 and positive electrode 103 are coupled to one or more photovoltaic cells 113 to produce an electrical potential between negative electrode 109 and positive electrode 103 when a photocurrent is generated in the one or more photovoltaic cells 113 in response to one or more photovoltaic cells 113 receiving the light emitted from photofuel 115. The electrodes depicted may include a metal, oxide, semiconductor, conductive polymers, or other compounds (e.g., copper, gold, silver, aluminum, zinc tin oxide, indium tin oxide, doped silicon, poly(3,4-ethylenedioxythiophene) polystyrene sulfonate, or the like). As shown, insulator 105 (e.g., ceramic, polymer, or the like) is disposed between two of the electrodes to prevent shorting.

It is appreciated that various techniques may be employed to extend the working lifetime of photofuel 115 in the receptacle: cooling with thermoelectric coolers, or the like, and employing systems to maintain a relatively constant pH in the receptacle, etc. The receptacle may possess mirrored walls (e.g., including reflector 111) such that any prematurely-emitted light may be reabsorbed to recharge photofuel 115 without significant loss, or to reduce the total required area of photovoltaics cells 113. The receptacle may be opaque so photofuel 115 is not exposed to light, which may prevent degradation of the molecules. In some embodiments, the receptacle may be positively or negatively pressurized, and may include an inert environment (e.g., $N_2$, Ar, or the like) to prevent degradation of photofuel 115, or other components, due to chemical reaction with compounds in the air.

As depicted, the receptacle is structured to fully contain photofuel 115 within the receptacle (e.g., photofuel 115 does not flow in or out of the receptacle in any meaningful quantity). Although in the depicted example, the receptacle is formed from constituent active components of the system 100, in other embodiments receptacle may include a glass, metal, or polymer container. It is appreciated the receptacle may be fabricated out of any material and in any shape so that photofuel 115 can be contained within.

In the depicted embodiment, charging electrode 101 is electrically coupled to the photofuel 115, and charging includes flowing a current through an electrochemical photofuel recharging system, using charging electrode 101 (and possibly one or more of the other electrodes depicted). In the depicted example, a significant volume of photofuel 115 can simultaneously be induced to discharge its energy as light, which is converted to an electrical current via photovoltaic cells 113 and travels through an external circuit (via the positive 103 and negative electrodes 109). There are many potential compounds to realize photofuel 115, so there are many ways to stimulate charge/discharge of photofuel 115, but in some embodiments a third electrode (e.g., charging electrode 101) could be used to control this reaction (e.g., by Joule heating, light emission, an electrical potential, etc.). Put another way, charging electrode 101 may also be used (in addition to charging photofuel 115) to control discharge reaction kinetics of the photofuel by applying an electric field. Since the photofuel does not necessarily have to move during charge or discharge, the photofuel can be any of a pressurized gas, liquid, or solid.

In the depicted embodiment, reflector 111 is disposed opposite the photovoltaic cell 113, and photofuel 115 is disposed between the one or more photovoltaic cells 113 and the one or more reflectors 111. Reflector 111 may be a mirror that reflects wavelengths of light emitted from photofuel 115. Reflectors 111 may be less expensive than photovoltaic cells 113, so reflectors 111 may be used to optimize the amount of light absorbed by each photovoltaic cell 113.

Figure 1B:
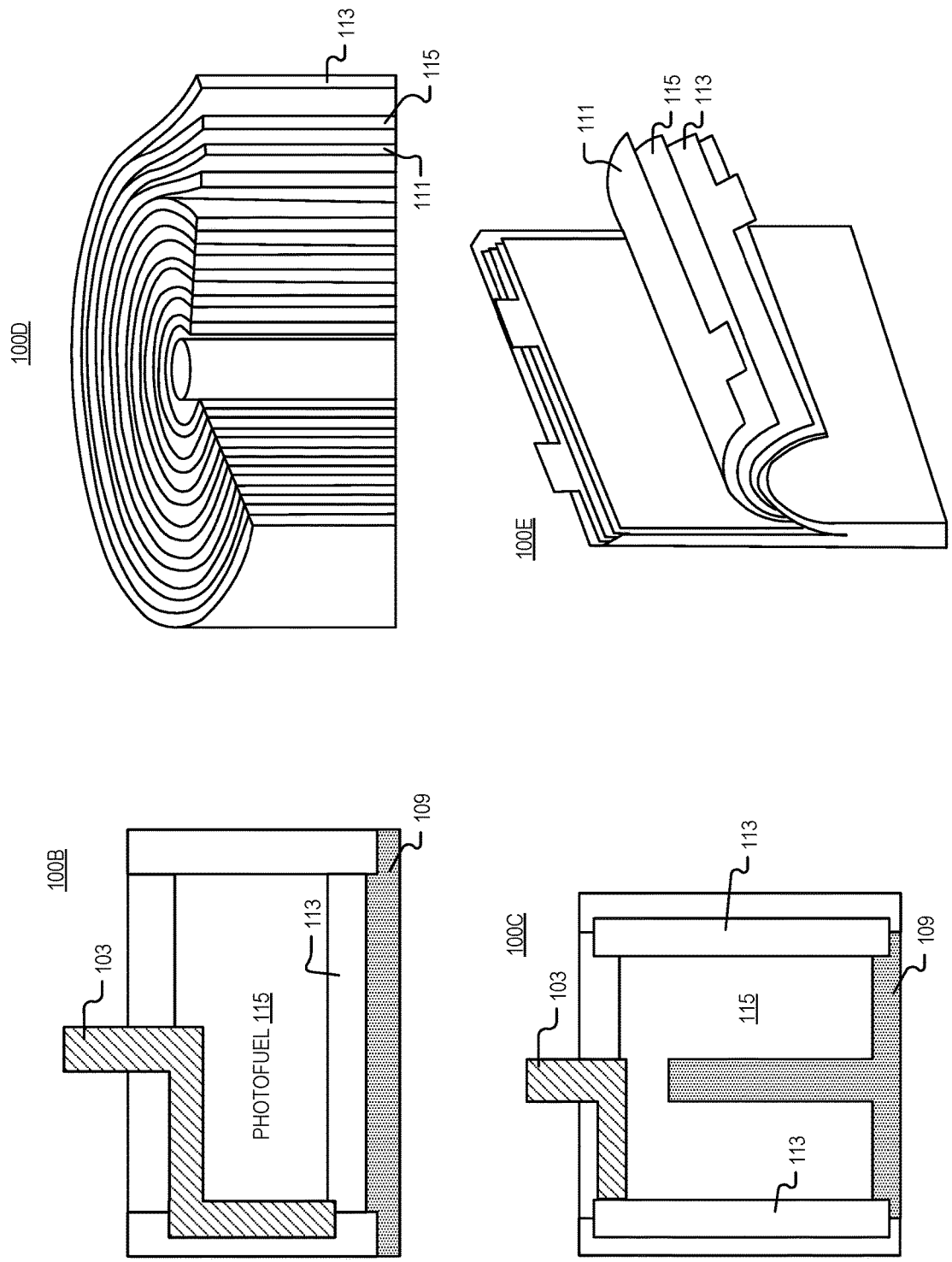
FIG. 1B illustrates device architectures that may be used with the photovoltaic power system of FIG. 1A, in accordance with embodiments of the disclosure.

FIG. 1B illustrates device architectures 100B-100E that may be used with the photovoltaic power system of FIG. 1A, in accordance with embodiments of the disclosure. As shown, a variety of photovoltaic battery geometries are possible such as cylindrical structures (e.g., coin cells 100B, rod-in-center 100C, jelly rolls 100D, or rectangular—prismatic or pouch—structures 100E) which may be similar to the wide variety of closed-cell electrochemical battery geometries. The photovoltaic batteries depicted herein can be conformed to nearly any shape, with the main constraint being absorbing emitted light in a photovoltaic converter without having the light take a tortuous or long path (to avoid parasitic absorption).

Device architecture 100B shows a cross section of a coin cell (cylindrical) device. As illustrated, positive electrode 103 enters the top of the receptacle and wraps around the side wall of the receptacle to contact a first side of photovoltaic cell 113. On the opposite side of photovoltaic cell 113 is negative electrode 109. Both photovoltaic cell 113 and negative electrode 109 are disposed on the flat bottom surface of the receptacle.

Device architecture 100C shows a cross section of ground rod (which may be part of negative electrode 109) that extends into the center of a concentric shell of photovoltaic cells 113. As shown, negative electrode 109 and positive electrodes 103 contact the edges of photovoltaic cells 113, and wrap around the curved inner surfaces of the cylindrical receptacle.

Device architecture 100D depicts a "jellyroll" architecture in which photofuel 115 is sandwiched between substantially concentric sheets of reflectors 111 and/or photovoltaic cells 113. In this example, the reflectors 111 and/or photovoltaic cells 113 may be coated with a solid or gel-like photofuel 115 or the photofuel 115 may be a liquid that is pumped between the layers.

Similarly, device architecture 100E depicts a rectangular pouch structures. Here substantially parallel layers (e.g., ±10 degrees of rotation) of reflectors 111 and/or photovoltaic cells 113 with photofuel 115 disposed between are disposed within a pouch/receptacle. The layered structured depicted may help to optimize absorption (and minimize reabsorption by the photofuel 115) since a large surface of photofuel 115 is exposed to photovoltaic cells 113 and reflectors 111.

Figure 2:
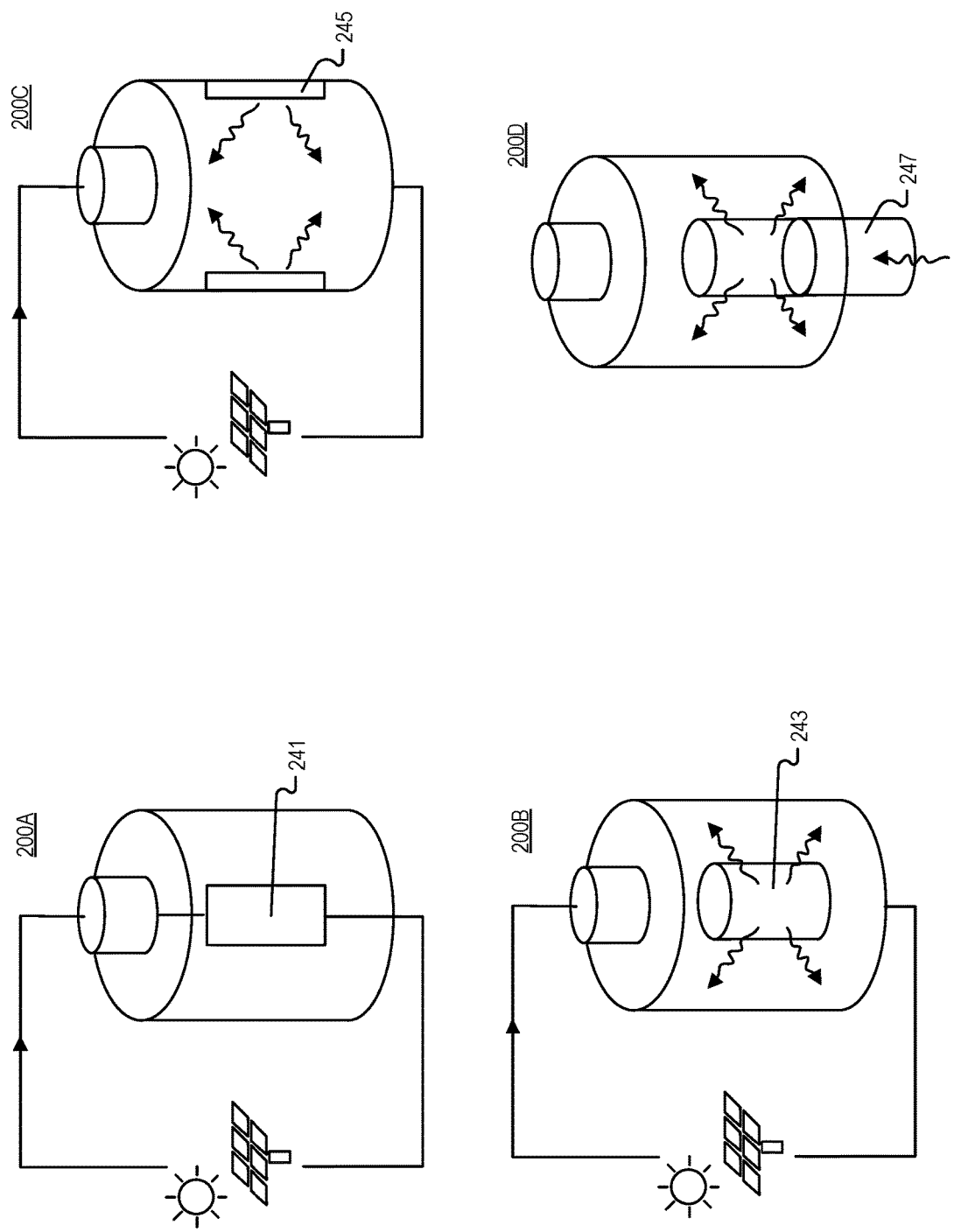
FIG. 2 illustrates charging systems that may be used with the photovoltaic power system of FIGS. 1A and 1B, in accordance with an embodiment of the disclosure.

FIG. 2 is an illustration of charging systems coupled to the receptacle, at least in part, to charge the photofuel in the power system of FIGS. 1A and 1B, in accordance with an embodiment of the disclosure. As shown, rechargeable photovoltaic batteries can be constructed, and these batteries may be recharged through an external input of electrical or optical energy. A few embodiments are illustrated in FIG. 2.

Photovoltaic battery system 200A uses an electrical or electrochemical internal system 241 that recharges the photofuel. This system could use the same positive and negative electrodes used in discharge (see e.g., FIG. 1A positive and negative electrodes), along with the charging electrode and bypass diodes to ferry current through the charging elements.

Photovoltaic battery systems 200B and 200C show an optical charging system: external electrical energy could drive internal light emission that recharges the photofuel, e.g., by reverse-biasing photovoltaic cells 245 or powering a laser or LED 243 that is positioned to emit the charging light into the photofuel. The emission spectrum of the charging light may overlap the absorption spectrum of the photofuel.

Photovoltaic battery systems 200D shows another optical charging system: an external optical fiber 247 (e.g., one embodiment of a light guide) couples to the receptacle to input charging light and charge/recharge photofuel. Charging light may originate from the sun, LEDs, laser energy, or the like, and charging light is injected into optical fiber 247. The optical fiber 247 may mate to an internal light distribution system to recharge the photofuel.

Figure 3:
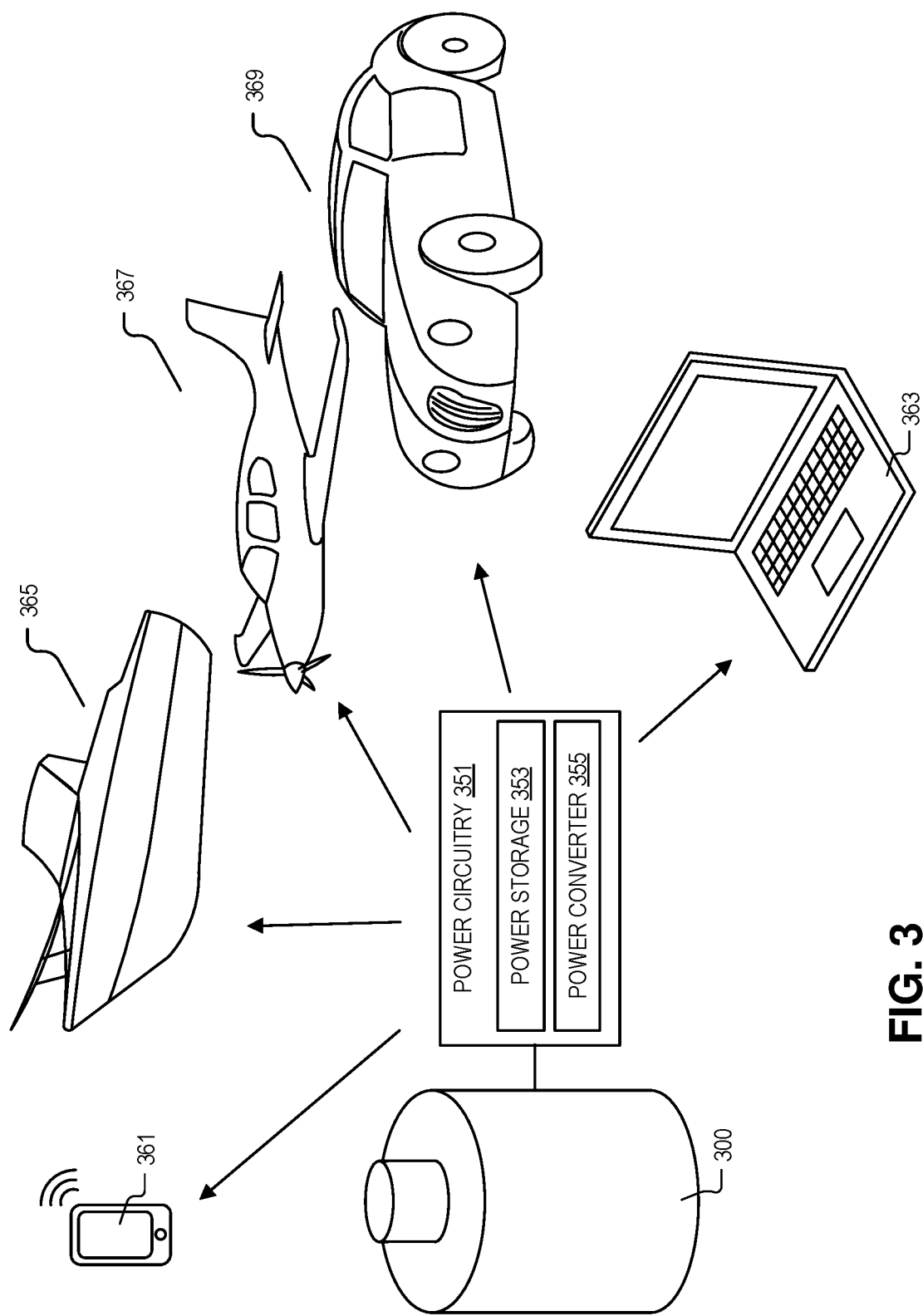
FIG. 3 is an illustration of devices that the power system of FIG. 1A may be used with, in accordance with an embodiment of the disclosure.

FIG. 3 illustrates devices that the power system 300 may be used with, in accordance with an embodiment of the disclosure. As shown, power circuitry 351 is coupled to the negative electrode and positive electrode in power system 300 (see, e.g., FIG. 1A), where power circuitry 351 includes power storage unit 353 coupled to receive the electrical potential from the one or more photovoltaic cells, and power converter (coupled to the power storage unit 353) to output a DC or AC waveform. The power storage unit 353 may include one or more capacitors, an ultra-capacitor, batteries or the like, to receive the unfiltered electrical output from one or more photovoltaic cells. It is appreciated that the electrical output from one or more photovoltaic cells may be variable due to kinetic variations in the light production reaction (e.g., caused by temperature), or the like. Accordingly, storage unit 353 may be used as a power filter. The electrical charge contained in storage unit 353 may then be accessed by a power converter 355, which may output smooth consistent DC waveform (e.g., a flat 5, 10, 20, 50 V). Power converter 355 may include one or more switches (e.g., MOSFETs, GaN high-voltage switches, or the like) as well as diodes, inductors, and resistors to access power in power storage unit 353. In some embodiments, power converter 355 may include a controller to control the DC waveform output from power circuitry 351. For example, the controller may determine when to turn on/off a power switch in the power converter.

In some examples, the system depicted herein may be used to power laptop 363 or portable phone/tablet 361. For example, the entire system 300 may be swapped out of the various devices. One of skill in the art will appreciate that the devices depicted are just examples of the possible devices that may be supplied power using system 300, in accordance with the teachings of the present disclosure.

In the depicted embodiment, the DC waveform may be output from the power circuitry 351 to an electric motor (e.g., disposed within boat 365, plane 367, and car 369). Electric motor may be mechanically coupled to provide the mechanical energy to move one of an aircraft body, a boat hull, or a vehicle chassis depicted. In one embodiment, power circuitry 351 may be coupled to other devices (e.g., lighting, microelectronics, or the like). It is appreciated that the photovoltaic power sources depicted may include thermal management functionality such as radiator for photofuel waste heat discharge or storage. For example, cooling channels with separate cooling fluid or cold air may be circulated and heat rejected through radiator to the environment. In one or more embodiments, the photovoltaic battery systems may include safety mechanisms to catch photofuel in event of rupture (e.g., secondary containment receptacle holding the reactor, a drip pan, or the like).

FIGS. 4A-4D illustrate chemicals and reaction mechanisms that may be used in the photofuel, in accordance with embodiments of the disclosure. It is appreciated that there are many ways to activate light emission, depending on the type of photofuel used, for example: catalytic or enzymatic release of energy, which may or may not be used with a catalyst agent fixed near the surface of the photovoltaic cells (such that the reaction only happens while in the receptacle); thermal or optical activation (e.g., a "spark plug" type of initiation, which causes a local region to discharge light and propagates the reaction either optically or thermally); electrochemiluminescent reaction; pH initiation, or other chemical reaction; phase change (e.g., photofuel may be stored as a solid or liquid, and subsequently discharged in gas or liquid state, and may be mixed with other materials, such as gases, solvents, dyes, etc.); other on/off switches (e.g., electric or magnetic field, pressure). It is appreciated that biology inspired emission pathways (e.g., firefly luciferen emitting light via luciferase-catalyzed oxidation) may also be viable ways to produce a photofuel. As stated, photofuel may include light emitting molecules as well as solvents (which may be transparent), catalysts, reaction inducing chemicals, etc. Several embodiments are discussed below as they relate to the figures.

FIG. 4A shows one example of chemicals included in a photofuel. The reaction mechanism used to produce the light here is an optical isomer transformation (e.g., the transformation of optically-switched norbornadiene to quadricyclane) that could be built into a high quantum efficiency dye like 9,10-diphenylanthracene (depicted). If a sufficiently high energy transformation is built into such a dye and efficiently release its energy via luminescence, the energy density of this type of reaction could match or exceed the chemistry of many battery technologies.

FIG. 4B depicts a delayed fluorescence reaction that is activated either thermally or with a metal catalyst. Depicted is a triquinolonobenzene molecule has a long-lived triplet state, which can be thermally excited for delayed fluorescence. Also depicted is an example band diagram for molecule (which may be similar to triquinolonobenzene in that it exhibits delayed fluorescence), that has an excited state (T1) and electrons in this state are inhibited from decaying directly to the ground state (G). Accordingly, in order for electrons in the excited state T1 to reach the ground state (G) and emit a photon, they must be excited to a different excited state (S1). Thus, the molecule could be charged (to get electrons into energy state T1), and then thermally or catalytically excited to get the electrons into energy state S1 where they will decay to the ground state and emit light.

Figures 4C, 4D:
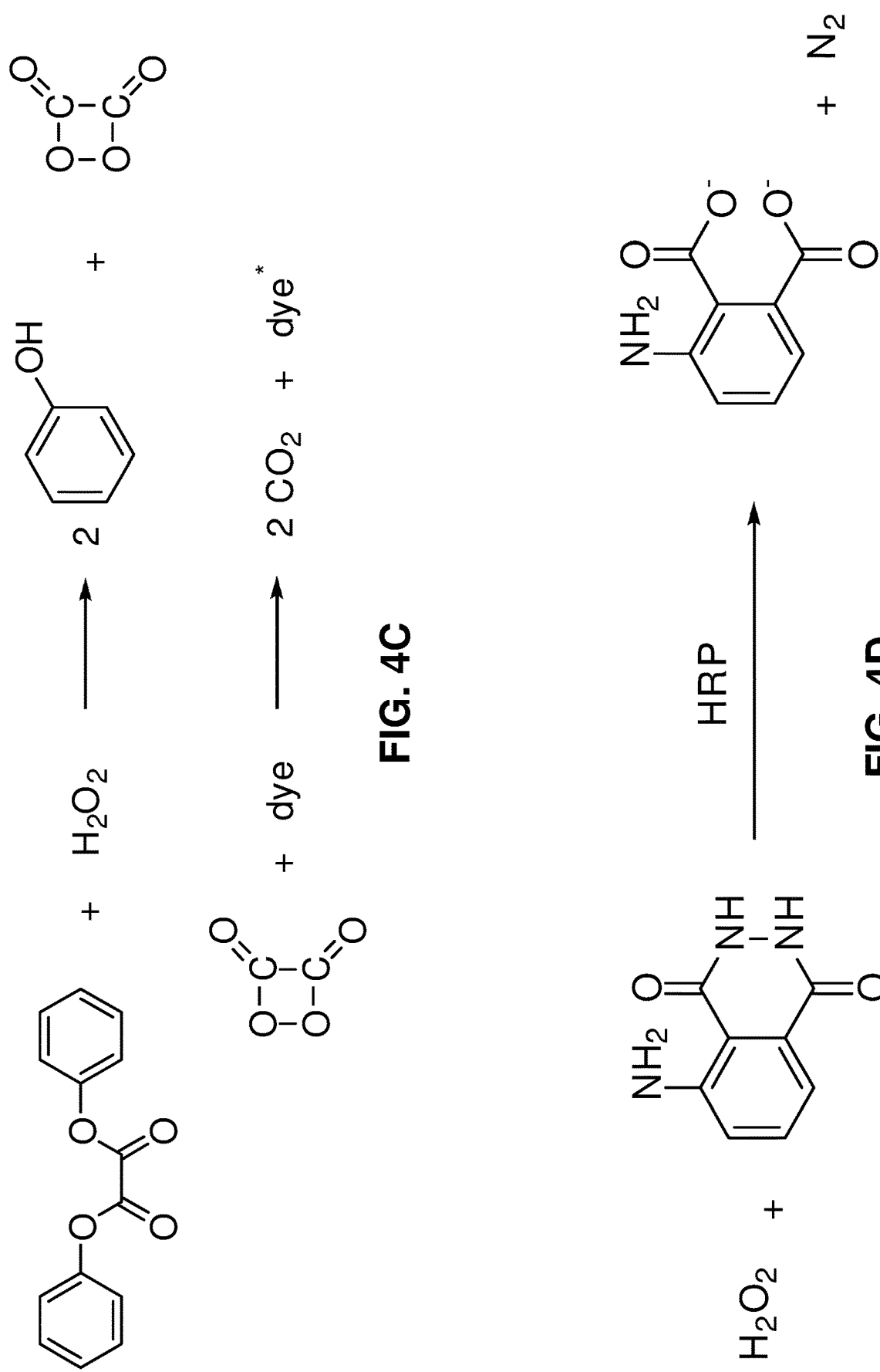

FIG. 4C shows a Cyalume reaction, where hydrogen peroxide ($H_2O_2$) oxidizes diphenyl oxalate to produce metastable 1,2-dioxetanedione, which then gives up its energy to excite a dye. The dye then relaxes by light emission.

FIG. 4D shows a horseradish-peroxidase-(HRP)-catalyzed luminescence reaction for luminol. It is appreciated that this is just one catalyst-type reaction that may be used to produce the light from the photofuel.

Figure 5:
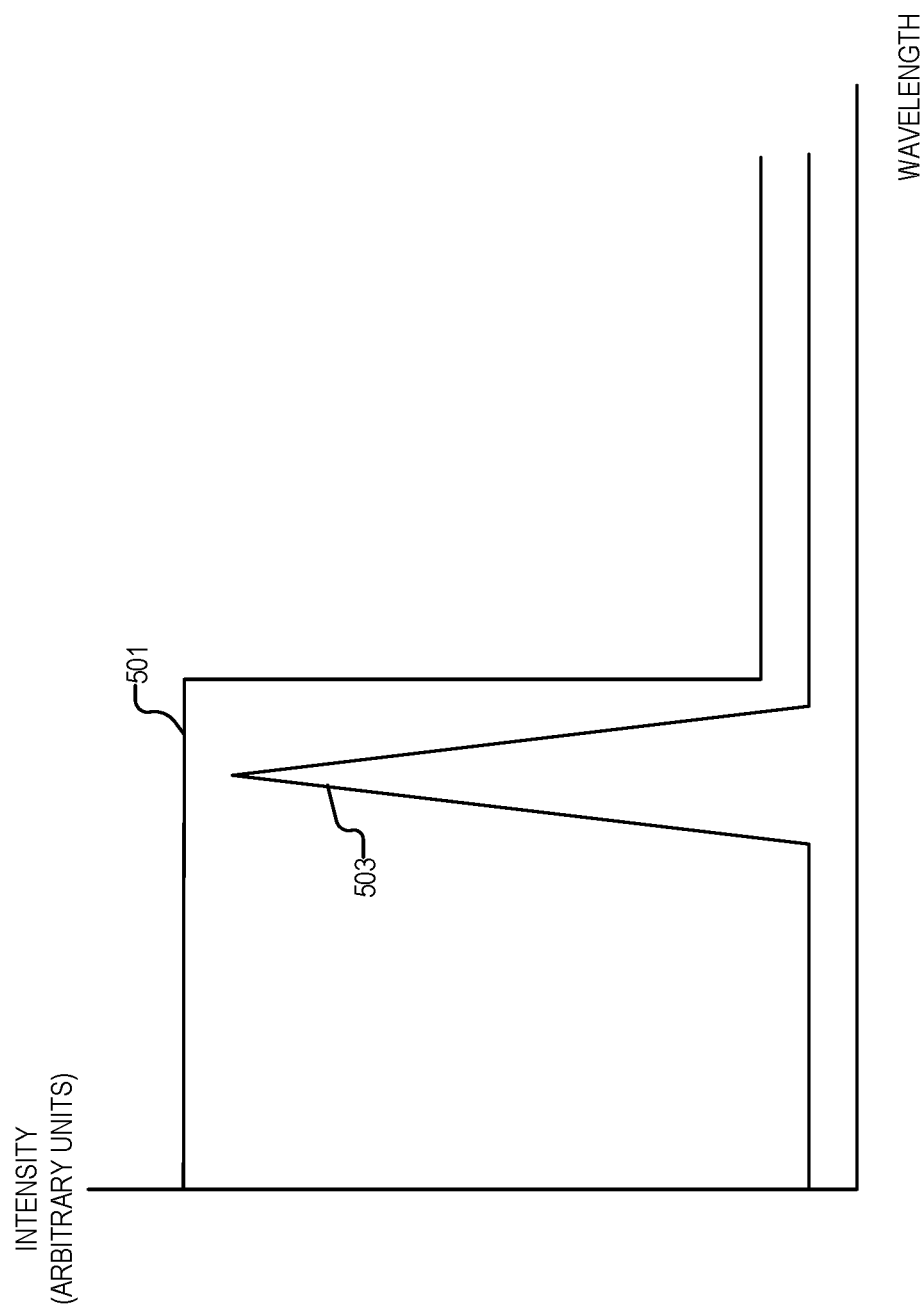
FIG. 5 illustrates an example absorption spectrum of photovoltaic cells and the emission spectrum of the photofuel, in accordance with embodiments of the disclosure.

FIG. 5 illustrates an example absorption spectrum of photovoltaic cells 501 and an example emission spectrum of the photofuel 503, in accordance with embodiments of the disclosure. As shown, the absorption spectrum of the one or more photovoltaic cells 501 overlaps the emission spectrum 503 of the photofuel. In the depicted embodiment, the photofuel may emit relatively monochromatic (e.g., ±5 nm from the emission peak) light. The solar cell may be fabricated to absorb all light that the photofuel emits. Since the photofuel may emit basically one wavelength of light, the photovoltaic cell may require less optimization than cells that capture sunlight since absorption of only one wavelength needs to be designed for. Thus, the photovoltaic cells in the reactor may be less expensive than high-efficiency tandem solar cells. For example, the photofuel may be designed to emit light at frequencies just above the absorption onset (e.g., to maximize photocurrent while minimizing thermalization losses) of the photovoltaic cells. In some embodiments, the photofuel may have more than one emission peak; accordingly, solar cell(s) with an absorption spectra that correspond to the emission peaks may be used.

Figure 6:
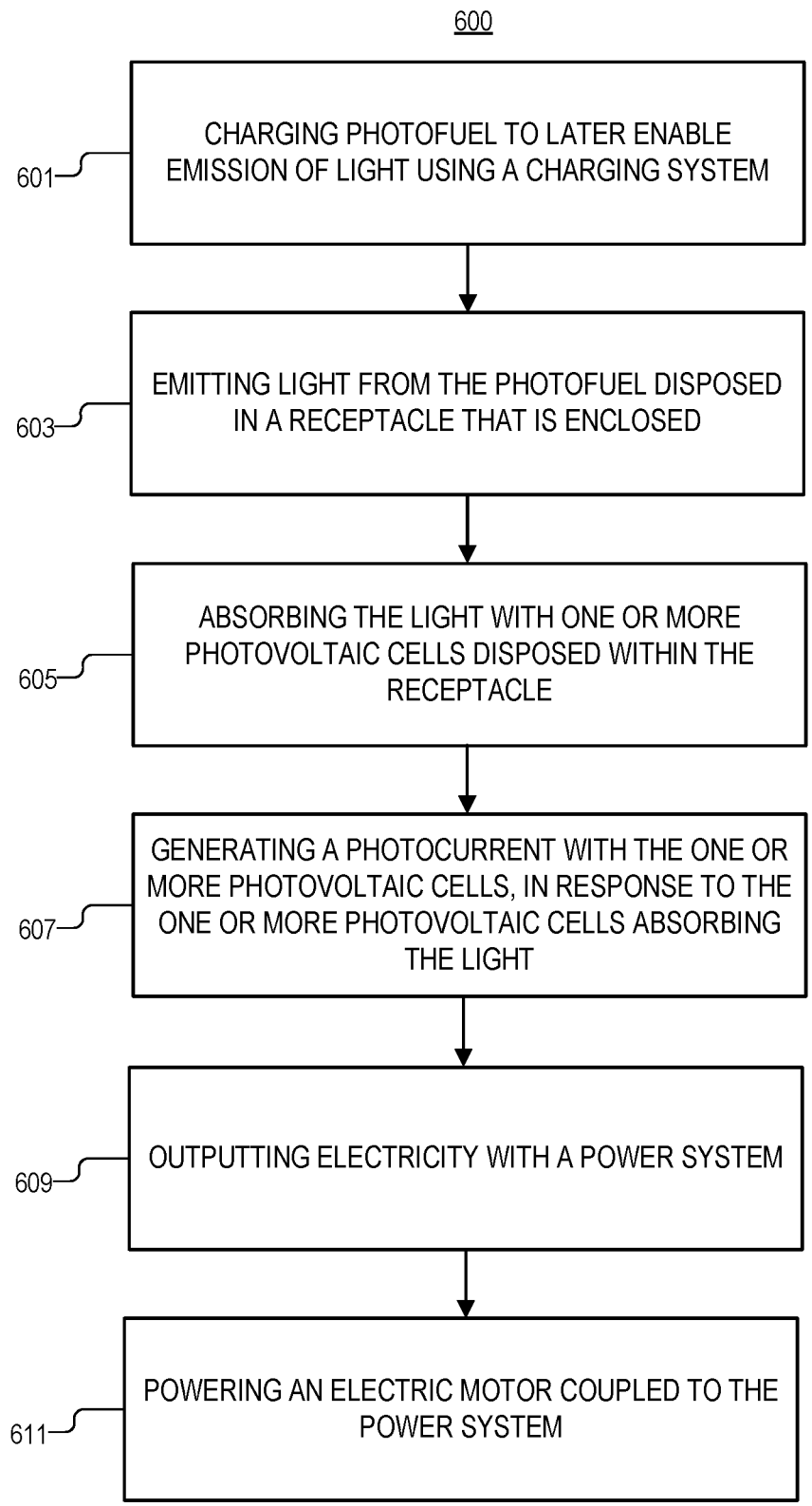
FIG. 6 illustrates a method for generating power, in accordance with an embodiment of the disclosure.

FIG. 6 is an illustration of method 600 for generating power, in accordance with an embodiment of the disclosure. The order in which some or all of process blocks 601-611 appear in method 600 should not be deemed limiting. Rather, one of ordinary skill in the art having the benefit of the present disclosure will understand that some of method 600 may be executed in a variety of orders not illustrated, or even in parallel. Additionally, method 600 may include additional blocks or have fewer blocks than shown, in accordance with the teachings of the present disclosure.

Block 601 illustrates charging the photofuel to later enable emission of light, using a charging system coupled, at least in part, to the receptacle. As shown above, charging system may include using a charging electrode to flow a current through the photofuel. It is appreciated that the positive, negative, and charging electrodes may be used to control charge/discharge rate. In some embodiments, charging includes emitting charging light into the photofuel with light emitting diodes or an optical fiber coupled to pump charging light into the photofuel. In some embodiments, the charging light has a greater energy than the light emitted from the photofuel post-charging, and the charging light has an greater than or equal to the bandgap energy of the photofuel.

Block 603 describes emitting light from a photofuel disposed in a receptacle that is enclosed. In some examples, emitting the light from the photofuel includes emitting the light through at least one of an isomer transformation, a chemiluminescent reaction, an electrochemiluminescent reaction, or delayed fluorescence (see, e.g., FIGS. 4a-4D). Photovoltaic battery discharge could be initiated and proceed in a variety of ways, for example, the light emission reaction may be initiated by: using a third "control/charging" electrode (see e.g., FIG. 1A) which directly stimulates the photofuel or controls an internal management system which stimulates the photofuel; causing internal movement/pumping of either the fuel or a catalyst to control the discharge; applying an electric or magnetic field; using a system which slightly adjusts pH of the photofuel to control discharge; using an optical signal (e.g., infrared light) to stimulate the release of the photofuel's energy (e.g., as green light); using a small amount of heating (e.g., like a glow plug); employing electrical or thermal activation of a catalyst; initiating a phase change of the photofuel or some other component that is mixed with the photofuel. It is appreciated that any of these discharge mechanisms may be stimulated with use of the standard 2-electrode battery configuration, e.g., reverse biasing the cell with a certain recognizable signal, which causes an internal controller to initiate discharge. Furthermore, this management system may make use of a small amount of other energy storage, e.g., a standard capacitor or closed-cell electrochemical battery to initiate photofuel discharged (e.g., similar to a battery's role in an internal combustion engine).

Block 605 shows absorbing the light with the one or more photovoltaic cells disposed within the receptacle. In some embodiments, absorbing the light with the one or more photovoltaic cells includes using the one or more photovoltaic cells that have an absorption spectrum that overlaps an emission spectrum of the photofuel, at least in part.

Block 607 illustrates generating a photocurrent with the one or more photovoltaic cells, in response to the one or more photovoltaic cells absorbing the light. The photocurrent produces an electrical potential difference between a negative electrode coupled to the one or more photovoltaic cells and a positive electrode coupled to the one or more photovoltaic cells. This potential difference may be used to power pieces of circuitry.

Block 609 illustrates further comprising outputting electricity with power circuitry coupled to the negative electrode and the positive electrode to receive the potential difference. The power circuitry may include a power storage device (e.g., a capacitor to smooth the output of the photovoltaic battery) and a power converter coupled to output a smooth DC power supply.

Block 611 depicts powering an electric motor coupled to the power system, wherein in response to receiving the electricity the electric motor outputs mechanical energy. As discussed above, in some embodiments the motor may be used to move one of a boat hull, a vehicle chassis, or an aircraft body with the mechanical energy output from the electric motor.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A photovoltaic power system, comprising:
a photofuel having a molecular structure to emit light;
a receptacle including the photofuel disposed within the receptacle;

1. one or more photovoltaic cells positioned within the receptacle and configured to receive the light when emitted from the photofuel;
a negative electrode coupled to the one or more photovoltaic cells;
a positive electrode coupled to the one or more photovoltaic cells to produce an electrical potential between the negative electrode and the positive electrode when a photocurrent is generated by the one or more photovoltaic cells in response to the one or more photovoltaic cells receiving the light emitted from the photofuel; and
a control electrode disposed through the receptacle, wherein the control electrode is configured for charging of the photofuel within the receptacle or inducing emission of the light from the photofuel via application of an electrical potential to the control electrode,
wherein the photofuel is permanently sealed within the receptacle and the photofuel is not flowed in, out, or throughout the receptacle during operation.

2. The photovoltaic power system of claim 1, wherein an absorption spectrum of the one or more photovoltaic cells positioned in the receptacle overlaps an emission spectrum of the photofuel, at least in part.

3. The photovoltaic power system of claim 1, wherein the one or more photovoltaic cells are arranged into substantially parallel or concentric sheets, and wherein the photofuel is disposed between the substantially parallel sheets.

4. The photovoltaic power system of claim 3, further comprising one or more reflectors, wherein the photofuel is disposed between the one or more photovoltaic cells and the one or more reflectors.

5. The photovoltaic power system of claim 1, further comprising:
a charging system disposed within the receptacle and coupled to the control electrode to charge the photofuel to later enable emission of the light.

6. The photovoltaic power system of claim 5, wherein the charging system is electrically coupled to the photofuel to flow a current through the photofuel using the control electrode.

7. The photovoltaic power system of claim 5, wherein the charging system includes one or more light emitting diodes positioned within the receptacle or on an interior surface of the receptacle to emit charging light into the photofuel within the receptacle.

8. The photovoltaic power system of claim 5, wherein the charging system includes a light guide coupled to the receptacle to pump charging light into the receptacle to charge the photofuel.

9. The photovoltaic power system of claim 1, further comprising power circuitry coupled to the negative electrode and positive electrode, wherein the power circuitry includes:
a power storage unit coupled to receive the electrical potential from the one or more photovoltaic cells; and
a power converter coupled to the power storage unit to output a DC waveform or an AC waveform.

10. The photovoltaic power system of claim 9, wherein the receptacle and the power circuitry are disposed in one of a laptop, a cellphone, or a tablet.

11. The photovoltaic power system of claim 9, further comprising an electric motor coupled to the power circuitry to receive the DC waveform or the AC waveform and convert the electricity into mechanical energy.

12. The photovoltaic power system of claim 11, wherein the receptacle, the power circuitry, and the electric motor are disposed within one of an aircraft body, a boat hull, or a vehicle chassis.

13. A method for generating power, comprising:
emitting light from a photofuel disposed within a receptacle, wherein the receptacle is permanently sealed and the photofuel is not flowed in, out, or throughout the receptacle during operation to generate a photocurrent;
absorbing the light with one or more photovoltaic cells disposed within the receptacle;
generating the photocurrent with the one or more photovoltaic cells, in response to the one or more photovoltaic cells absorbing the light, wherein the photocurrent produces an electrical potential difference between a negative electrode coupled to the one or more photovoltaic cells and a positive electrode coupled to the one or more photovoltaic cells; and
charging and discharging the photofuel within a common volume of the receptacle without flowing the photofuel, wherein a control electrode is disposed through the receptacle, the control electrode is configured for charging of the photofuel within the receptacle or inducing emission of the light from the photofuel via application of an electrical potential to the control electrode.

14. The method of claim 13, wherein emitting the light from the photofuel includes emitting the light through at least one of an isomer transformation, a chemiluminescent reaction, an electrochemiluminescent reaction, or a delayed fluorescence.

15. The method of claim 13, wherein absorbing the light with the one or more photovoltaic cells includes using the one or more photovoltaic cells having an absorption spectrum that overlaps an emission spectrum of the photofuel, at least in part.

16. The method of claim 13, further comprising outputting electricity with power circuitry coupled to the negative electrode and the positive electrode to receive the potential difference.

17. The method of claim 16, further comprising powering an electric motor coupled to the power circuitry, wherein in response to receiving the electricity the electric motor outputs mechanical energy.

18. The method of claim 17, further comprising moving one of a boat hull, a vehicle chassis, or an aircraft body with the mechanical energy output from the electric motor.

19. The method of claim 13, further comprising charging the photofuel to later enable emission of the light using a charging system coupled to the receptacle.

20. The method of claim 19, wherein charging the photofuel includes flowing a current through the photofuel with a charging electrode disposed in the receptacle.

21. The method of claim 19, wherein charging the photofuel includes emitting charging light into the photofuel with light emitting diodes disposed in the receptacle or on an interior surface of the receptacle.

22. The method of claim 19, wherein charging the photofuel includes pumping charging light into the receptacle with a light guide.

23. A photovoltaic power system, comprising:
a photofuel having a molecular structure to emit light;
a receptacle including the photofuel disposed within the receptacle, wherein the photofuel is permanently sealed within the receptacle and does not flow in, out, or throughout the receptacle during charging and discharging operations;
one or more photovoltaic cells positioned within the receptacle and configured to receive the light when emitted from the photofuel;
a negative electrode coupled to the one or more photovoltaic cells; and a positive electrode coupled to the one or more photovoltaic cells to produce an electrical potential between the negative electrode and the positive electrode when a photocurrent is generated by the one or more photovoltaic cells in response to the one or more photovoltaic cells receiving the light emitted from the photofuel, a control electrode disposed through the receptacle, the control electrode configured for charging of the photofuel within the receptacle or inducing emission of the light from the photofuel via application of an electrical potential to the control electrode.

24. The photovoltaic power system of claim 23, further comprising:

a light source disposed within the receptacle and coupled to the control electrode, wherein the light source emits charging light for charging the photofuel within the receptacle when a current or a potential is applied to the control electrode.

25. The photovoltaic power system of claim 23, wherein the receptacle is a sealed, contiguous container without fluid lines for flowing the photofuel in or out of the container during the charging and discharging operations, and wherein the photovoltaic power system is configured to charge and discharge the photofuel within the sealed, contiguous container.

26. A photovoltaic power system, comprising:

a photofuel having a molecular structure to emit light;

a receptacle including the photofuel disposed within the receptacle;

one or more photovoltaic cells positioned within the receptacle and configured to receive the light when emitted from the photofuel;

a negative electrode coupled to the one or more photovoltaic cells;

a positive electrode coupled to the one or more photovoltaic cells to produce an electrical potential between the negative electrode and the positive electrode when a photocurrent is generated by the one or more photovoltaic cells in response to the one or more photovoltaic cells receiving the light emitted from the photofuel; and power circuitry coupled to the negative electrode and the positive electrode, wherein the power circuitry includes:

a power storage unit coupled to receive the electrical potential from the one or more photovoltaic cells; and a power converter coupled to the power storage unit to output a DC waveform or an AC waveform, wherein the receptacle and the power circuitry are disposed in one of a laptop, a cellphone, or a tablet.

* * * * *